United States Patent [19]

Kindler et al.

[11] Patent Number: 4,598,354
[45] Date of Patent: Jul. 1, 1986

[54] DATA INPUT AND OUTPUT DEVICE FOR A DRIVE REGULATION APPARATUS OPERATED BY A DIGITAL COMPUTER

[75] Inventors: Gerhard Kindler, Meggen; Ray Stanyard, Buchrain, both of Switzerland

[73] Assignee: Inventio AG, Hergiswil, Switzerland

[21] Appl. No.: 561,217

[22] Filed: Dec. 14, 1983

[30] Foreign Application Priority Data

Dec. 20, 1982 [CH] Switzerland ............... 7418/82

[51] Int. Cl.$^4$ ............... H02P 7/00; B66B 1/28
[52] U.S. Cl. ............... 364/174; 318/341; 318/345 R; 187/29 R; 364/130
[58] Field of Search ............... 364/130, 174, 167, 400; 318/341, 345 R, 345 C, 345 CB, 345 E, 345 G; 187/29 R

[56] References Cited

U.S. PATENT DOCUMENTS

| | | | |
|---|---|---|---|
| 4,090,116 | 5/1978 | Lippitt | 364/130 |
| 4,286,315 | 8/1981 | Johnson | 318/345 E |
| 4,346,434 | 8/1982 | Morinaga | 364/183 |
| 4,493,398 | 1/1985 | Kindler | 318/268 |

FOREIGN PATENT DOCUMENTS 0026406 4/1981 European Pat. Off. .
1302194 12/1972 Fed. Rep. of Germany .

OTHER PUBLICATIONS

Patents Abstract of Japan, vol. 6, No. 41, 13 Mar. 1982, p. 121P106 & JP-A-56 159 705 (Mitsubishi Denki K.K.) 09.12.1981.
Proceedings of the Institution of Electrical Engineers, vol. 119, No. 3, Mar. 1972, pp. 335-336, Stevenage, GB., Y. G. Paithankar et al.
Electronic Design, vol. 16, No. 1, 4 Jan. 1968, pp. 144-144a, Rochelle Park, USA, R. Billon.
IBM Technical Disclosure Bulletin; vol. 14, No. 2, Jul. 1971, p. 383, New York, USA, O. R. Buhler.
Electronic Industries, vol. 24, No. 6, Jun. 1965, p. 152, Radnor, USA, "Circuit Features Zero-Level Clipping".

Primary Examiner—Jerry Smith
Assistant Examiner—Allen MacDonald
Attorney, Agent, or Firm—Werner W. Kleeman

[57] ABSTRACT

The data input/output device of an elevator drive regulation receives actual values of the speed and of the displacement of an elevator cabin at related counters which are connected to related digital tachometers. The data are evaluated and transmitted via an interface to a digital computer of the drive regulation. The digital computer compares the data with stored reference values and computes input values for related adjusting members of the drive regulation. The computed input values are transmitted via the interface to and stored in a programmable multiple counter of the data input/output device. The programmable multiple counter contains three counters each of which is connected through a driver stage with a thyristor associated with one phase of a three-phase a.c.-elevator drive. A synchronizing device ensures that all thyristors are always ignited at any one time at the same phase angle which corresponds to the adjusting magnitude. A further counter of the programmable multiple counter is connected to a driver stage which acts upon the control of an eddy-current brake in the drive regulation.

4 Claims, 4 Drawing Figures

… … …

DATA INPUT AND OUTPUT DEVICE FOR A DRIVE REGULATION APPARATUS OPERATED BY A DIGITAL COMPUTER

BACKGROUND OF THE INVENTION

The present invention relates to a new and improved data input and output device for a drive regulation apparatus operated by a digital computer, wherein a path regulation circuit of the drive regulation apparatus is subordinate to at least one velocity regulation circuit, and wherein the data input and output device comprises at least one path counter which is connected to a digital tachometer.

In a known drive regulation apparatus which is operated by a digital computer according to German Published Pat. No. 1,302,194, granted Dec. 7, 1972, data output for the velocity circuit and the path regulation circuit takes place by way of a respective digital/analog converter connected at its output side with a regulator, so that the magnitude of adjustment is supplied to the adjusting member in analog form. During stabilization of such regulation apparatus by means of a current regulation circuit subordinated to the velocity regulation circuit, and assumption of the regulation function by a digital computer, it would be necessary, according to conventional technology, to provide a current converter and an analog/digital converter for the input of the current actual value. If a three-phase motor controlled by thyristors is used for the drive, then the digital computer must also carry out the computation of the ignition or firing times for each phase with which thyristors are associated.

SUMMARY OF THE INVENTION

Hence, with the foregoing in mind, it is a primary object of the present invention to control the adjusting members of the regulation apparatus directly digitally while avoiding the need for digital/analog converters and also to relieve the digital computer of the computation of the ignition or firing times for the thyristors of the individual phases of a three-phase supply.

Another important object of the present invention is to compute the current actual value, while eliminating the need for a current converter and a digital/analog converter, and to supply it to the digital computer, and also to supply the digital path and velocity actual values to the digital computer without the usually required copiers in the digital computer necessary for fixing the counter levels or states.

Now in order to implement these and still further objects of the invention which will become more readily apparent as the description proceeds, the new and improved data input and output device according to the present invention is characterized in that the magnitude of adjustment is transferred into a programmable multiple counter, the counters of which associated with each individual phase of the three-phase power supply are controllable by means of a synchronizing or synchronization device in such a way that the thyristors are ignited or fired at any one time at the same phase angle corresponding to the magnitude of adjustment. For the computation of the current actual value the constants of an excitation winding of the drive are stored in a read-only memory or store of the digital computer, and the current actual value can be computed in dependence of the last counter reading or state of a counter associated with the excitation winding of the programmable multiple counter. The path and velocity counters are directly connected with the data bus of the digital computer by way of bus drivers, and memory or store locations are provided for the input of the path and velocity actual values in a read-write memory or store of the digital computer. The results of a certain number of readings of the path and velocity counters are storable at each input procedure in the memory or store locations.

Some of the advantages of the invention are to be seen particularly in that the hardware resources required are considerably less compared with conventional data input and output technologies, and in that the digital computer is relieved by the proposed form of the data output. A further advantage consists of the feature that with the multiple reading of the path and velocity counter at each input procedure, mistakes are avoided which could arise with a single reading made during transient conditions.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Figure 1:
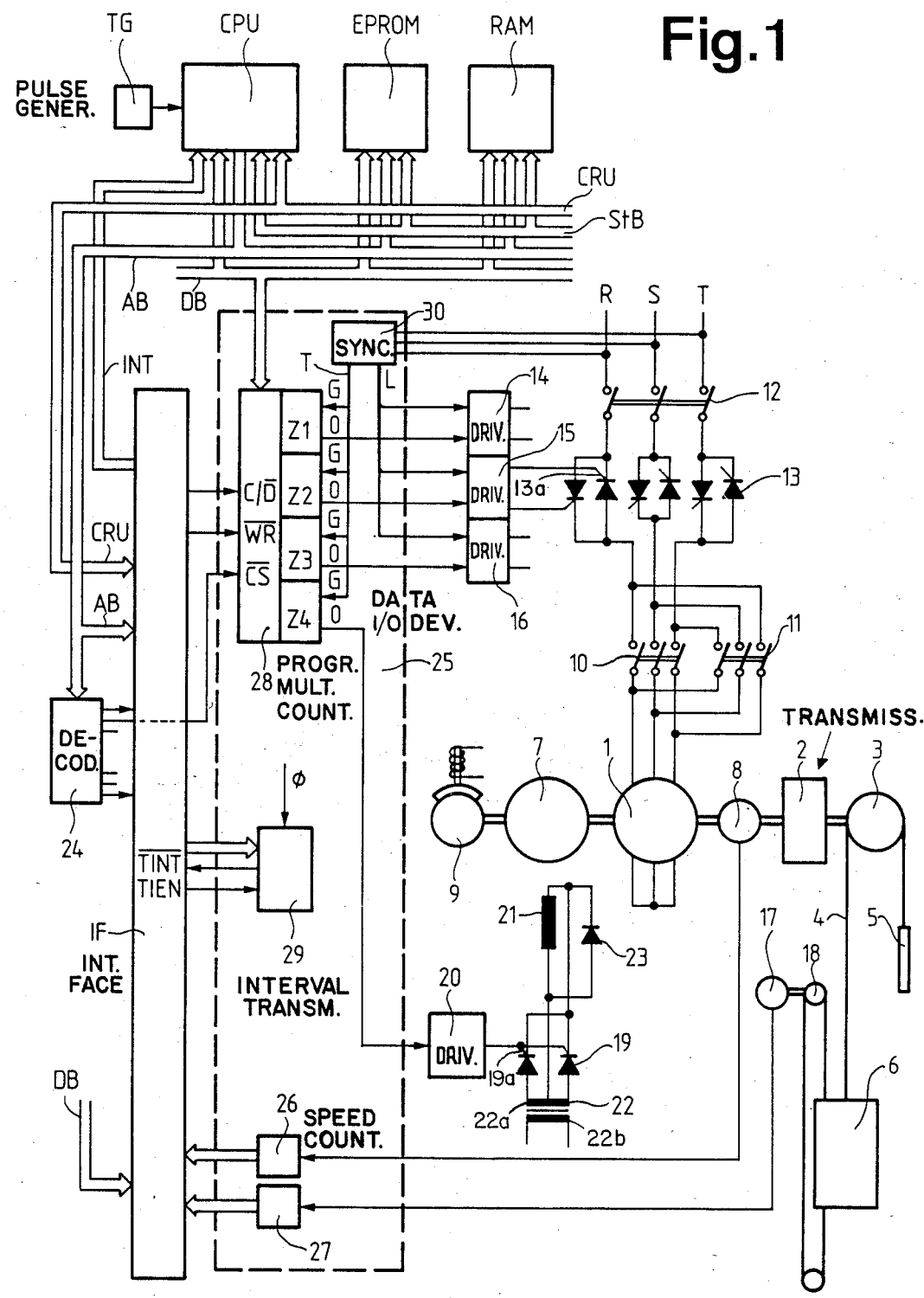
FIG. 1 is a schematic representation of the data input and output device according to the present invention, with a drive regulation apparatus operated by a digital computer.

Referring now to the drawings, in FIG. 1 reference numeral 1 designates the elevator displacement or drive motor of an elevator selected as an embodiment, which drives a cabin 6, which is suspended on a lifting or hoisting cable 4 and which is balanced by a counterweight 5, by way of a transmission 2 and a drive pulley 3. The drive motor 1, for example an asynchronous motor, is coupled with an eddy current brake 7, a first digital tachometer 8 and the brake drum 9 of an electro-mechanical brake, and is connected to a three-phase power supply by way of the contacts 10, 11 of a travel direction relay and the contacts 12 of a main relay. Between the contacts 10, 11 of the travel direction relay and the contacts 12 of the main relay there are disposed in each phase thyristors 13 in anti-parallel configuration. The control electrodes 13a of the thyristors 13 are connected with the outputs of drive or driver stages 14, 15, 16. The thyristors 13 and the driver stages 14, 15, 16 comprise the adjusting member of the elevator motor 1. A second digital tachometer 17 is preferably driven by way of a velocity limiter 18 by the elevator cabin 6. The digital tachometers 8, 17 are associated with a velocity regulation circuit and with a path regulation circuit of the elevator motor 1 as well as of the eddy current brake 7.

An adjusting member of the eddy current brake 7 consists of two thyristors 19 and a further drive or driver stage 20, the output of which is connected with the control electrodes of the thyristors 19. The thyristors 19, an excitation winding 21 of the eddy current brake 7 and the secondary winding 22a of a supply transformer 22 are connected together in mid-point configuration, so that with the application of an alternating voltage to the primary winding 22b of the supply transformer 22, a pulsating D.C.-voltage appears at the excitation winding 21. A diode 23 is connected in parallel to the excitation winding 21, and facilitates the flow of a current through the excitation winding 21 when the thyristors 19 are blocked. A current regulation circuit is subordinated to the speed control circuit of the eddy current brake 7, wherein the excitation current actual value is computed as described in greater detail hereinafter with reference to the operation of the circuitry.

A digital computer, preferably in the form of a microcomputer, operating as a regulator, consists of a microprocessor or central processing unit CPU, a read-only memory or store EPROM, a read-write or random access memory or store RAM, a pulse generator TG and an interface IF. The microprocessor CPU is connected by way of an address bus AB, a data bus DB and a control bus StB with the memories or stores EPROM, RAM, and is connected to the interface IF over a serial input-output bus CRU, the address and data buses AB, DB as well as over an interrupt connection INT. In the read-only memory EPROM there are provided memory or storage locations in which the functional correlations between the path-, velocity- and current regulation deviations and between the input magnitudes of the adjusting members taking into account the regulation characteristic are captured in tabular form. The digital computer also performs the function of a reference or set value transmitter, where path reference or set values are formed by numerical integration of permissible jolt values and acceleration threshold values stored in the read-only memory EPROM.

The interface IF is provided with an interruption priority module which is at the same time suitable for parallel data input and output. It comprises at its interface with the periphery interrupt inputs and individually addressable data input-output ports. The interrupt connection INT to the microprocessor CPU consists of a conductor for the interrupt demand or requirement and four conductors for the interrupt code. With the appearance of interrupt requirements an internal priority logic defines the priority of the interrupt signals sent by external modules and forms the address belonging to the highest priority as well as the interrupt for the microprocessor EPU. The interface IF also has addressable latches, for example multiple D-type flip-flops, for data output and bus drivers for data input.

A decoder 24 is connected on its input side with the address bus AB and on its output side with the modules of the interface IF and of the periphery which have to be identified at any one time.

A data input and output device 25 consists of a velocity or speed counter 26, a path or displacement path counter 27, a programmable multiple counter 28 and an interval transmitter 29 described in greater detail with reference to FIG. 4, which generates interruption demands for the microprocessor CPU. The velocity counter 26 and the path counter 27 are connected on their input side with the digital tachometers 8 and 17, and on their output side by way of bus drivers of the interface IF with the data bus DB, and pulse sequences proportional to velocity and path are supplied to the counters 26, 27 from the digital tachometers 8, 17. The programmable multiple counter 28 is connected to the interface IF by way of a read-write connection $\overline{WR}$ and a data release connection $C/\overline{D}$, and is also connected to the decoder 24 by way of a module selection terminal $\overline{CS}$ and to the data bus DB by way of data input ports. The counters Z1–Z4 of the programmable multiple counter 28 are in communication over start terminals G with trigger signal outputs T of a synchronization or synchronizing device 30 hereinafter described in greater detail with reference to FIG. 2. The overflow terminals 0 of the counters Z1–Z4 are connected with the driver stages 14, 15, 16, 20, the outputs of which are connected to the control electrodes 13a, 19a of the thyristors 13, 19. The synchronization device 30 is connected to the three-phase power supply and is connected by way of control signal terminals L with the driver stages 14, 15, 16 of the adjustment member of the elevator motor 1.

Figure 2:
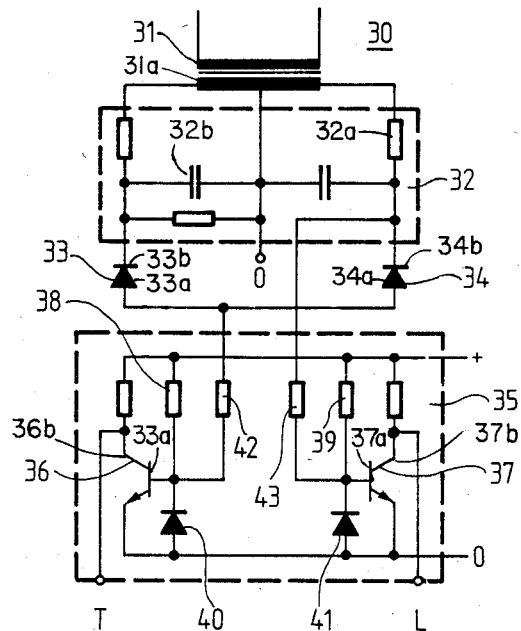
FIG. 2 is a circuit diagram of a synchronization device of the data input and output device according to FIG. 1.
Figure 3:
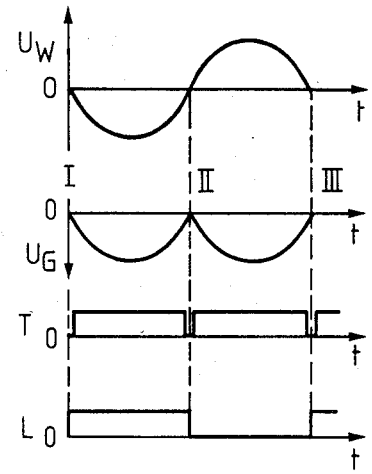
FIG. 3 is a diagram of the course of the supply voltage $U_W$, of the rectified voltage $U_G$, of the voltage at a trigger signal terminal T, and of the voltage at a control signal terminal L of the synchronization device according to FIG. 2.

The synchronization device 30 according to FIG. 2 consists for each phase of the three-phase power supply RST of a transformer 31, of a filter 32 made up of resistances 32a and capacitors 32b, of two diodes 33, 34 and of a signal generator 35. The anodes 33a, 34a of the diodes 33, 34 are connected together, while their cathodes 33b, 34b are connected by way of the filter 32 with the terminals of the secondary winding 31a of the transformer 31. The signal generator 35 comprises two transistors 36, 37, the bases 36a, 37a of which are connected by way of resistances or resistors 38, 39 with the positive pole or terminal and by way of diodes 40, 41 with the null potential of a voltage supply. The base 36a of the first transistor 36 is in addition connected to the anodes 33a, 34a of the diodes 33, 34 by way of a further resistance or resistor 42, while the base 37a of the second transistor 37 is connected over a further resistance or resistor 43 with the cathode 34b of the diode 34. The collector 36b of the first transistor 36 is connected to the trigger signal terminal T of the signal generator 35, while the collector 37b of the second transistor 37 is connected to the control signal terminal L. A trigger signal $T = 0$ is always generated at any one time when the negative d.c.-voltage $U_G$ appearing at the anodes 33a, 34a of the diodes 33, 34 has risen to zero (times I, II, III of FIG. 3). At these points in time the diode 40 is blocked and the first transistor 36 becomes conductive. During the negative half wave of the secondary supply volta $U_W$ the control signal $L = 1$ since at this point the diode 41 conducts and the second transistor 37 blocks (time interval I–II, FIG. 3). During the positive half wave the diode 41 blocks and the second transistor 37 conducts, so that the control signal $L = 0$ (time interval II–III, FIG. 3).

Figure 4:
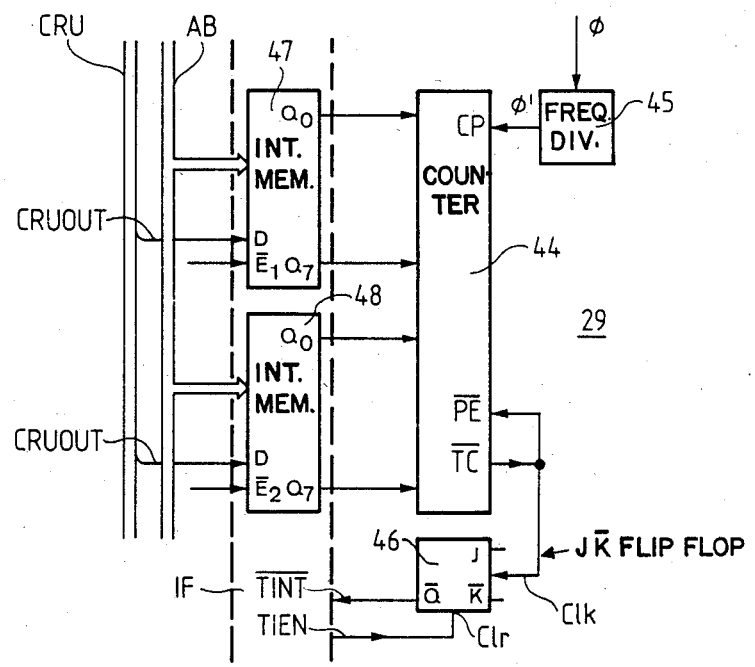
FIG. 4 is a schematic diagram of an interval transmitter associated with the data input and output device according to FIG. 1, for the generation of interruption requirements.

The interval transmitter 29 according to FIG. 4 consists of a 16-bit counter 44, a frequency divider 45 and a $J\overline{K}$ flip-flop 46. The data inputs of the 16-bit counter 44, for example formed of four 4-bit counters, are connected to the data outputs $Q_0$–$Q_7$ of an intermediate memory or store 47, 48 in the form of two addressable latches, for instance multiple D-type flip-flop of the interface IF. The intermediate memory or store 47, 48 is connected on its input side with the address bus AB, the data output conductor CRUOUT of the input-output bus CRU and to the decoder 24 (FIG. 1) by way of release terminals $E_1$, $E_2$. The output of the frequency divider 45 is connected with a clock pulse terminal CP of the 16-bit counter 44, where the clock pulse frequency $\phi'$ supplied to the 16-bit counter 44 for example is half of the clock frequency $\phi$ of the clock pulse generator TG supplied to the input of the frequency divider 45.

An overflow connection $\overline{TC}$ and a loading connection $\overline{PE}$ of the 16-bit counter 44 are connected with one another and with the clock terminal Clk of the $J\overline{K}$ flip-flop 46, the inputs J, $\overline{K}$ of which are in the logic states or conditions "1" and the output $\overline{Q}$ of which is connected with an interrupt input $\overline{TINT}$ of the interface IF. The clear terminal Clr of the $J\overline{K}$ flip-flop 46 is connected with a clearing or release terminal TIEN of the interface IF.

The data input and output device hereinbefore described operates as follows:

In the presence of an elevator travel command and an elevator cabin 6 which is ready for travel the microprocessor CPU generates a release signal TIEN=1 and the 16-bit counter 44 of the interval transmitter 29 begins to count upon appearance of the clock signal $\phi'$ (FIG. 4). When the overflow is reached the 16-bit counter 44 generates a signal, so that its overflow or overshoot terminal $\overline{TC}$ and its loading connection or terminal $\overline{PE}$ as well as the clock terminal Clk of the $J\overline{K}$ flip-flop 46 are set low, so that on the one hand a binary number, present at the data outputs $Q_0$–$Q_7$ of the intermediate memory or store 47, 48, is loaded into the 16-bit counter 44 and, on the other hand, since the release signal TIEN is "1" at the clearing terminal, an interruption requirement $\overline{TINT}=0$ appears at the output $\overline{Q}$ of the $J\overline{K}$ flip-flop 46. At the next rising edge of the clock signal $\phi'$ of the 16-bit counter 44 the latter begins to count anew, and its overflow terminal $\overline{TC}$ and its loading terminal $\overline{PE}$ as well as the clock terminal Clk of the JK flip-flop 46 are raised or set to high potential, without the interruption requirement $\overline{TINT}=0$ being cancelled.

The interruption requirement $\overline{TINT}$ is supplied to the interruption priority module of the interface IF, in which the address corresponding to the priority and the interruption requirement for the microprocessor CPU are formed. After receipt of the interruption demand or requirement $\overline{TINT}$ conducted by the interrupt connection INT (FIG. 1) the microprocessor CPU interrupts the running program in order to carry out the interruption program characterized by the address. According to this program the path actual value contained in the path counter 27 is read; the velocity reference value is computed, the velocity actual value contained in the velocity counter 26 is read and the velocity regulation deviation is computed. In dependence of the latter, the associated input value of the relevant adjusting member is called up from the read-only memory or store EPROM and the sign of the velocity regulation deviation decides which regulation path is activated. In order to avoid mistakes which could arise on reading during transient conditions, the velocity and path counters 26, 27 are read several times during each data input procedure. After storage of the read data the relevant actual values are determined or computed by an evaluation program. The excitation current actual value to be computed for the formation of the current regulation deviation is calculated taking into account constants of the excitation winding 21 stored in the read-only memory EPROM in dependence of the last value of the input magnitude of the adjusting member of the eddy current brake 7. In the course of the interrupt program a binary number is written into the intermediate memory or store 47, 48 (FIG. 4) of the interval transmitter 29. The complement of the binary number at any one time determines the time interval between two interruption demands or requirements $\overline{TINT}$.

The input magnitude of the relevant adjusting member thus determined at any time is now transferred in a writing operation into the programmable multiple counter 28. During this the terminals C/$\overline{D}$, $\overline{CS}$ and $\overline{WR}$ are set to a low potential by the microprocessor CPU and the input magnitude present on the data bus is written in (FIG. 1). An internal addressing logic which has been programmed in a previous operation determines that during regulation of the elevator motor 1 the counters Z1-Z3 are written into, and during regulation of the eddy current brake 7 the counter Z4 is written into. On arrival of the trigger signal T of the synchronization device 30 at the start terminal G of the relevant counter Z1-Z4 a counting process is initiated which upon achievement of overflow is terminated with the appearance of a pulse at the overflow terminal 0. This pulse is amplified in the corresponding driver stage 14, 15, 16, 20 and is supplied to the thyristor 13, 19 belonging to it, wherein the duration of the counting process to the overflow determines the ignition or firing instant and the control signal L of the synchronization device 30 allocates the ignition pulse to the positive or negative half wave of the applied voltage.

When the writing-in operation is concluded the interruption program is terminated, and the release signal TIEN goes to a low potential for a short time and the interuption requirement $\overline{TINT}$ is cancelled. The microcomputer can now continue with carrying out of the interrupted program until the next interruption requirement $\overline{TINT}$ is produced after a time interval determined by the interval transmitter 29, similar to the manner described earlier, and the same interrupt program begins to run again.

While there are shown and described present preferred embodiments of the invention, it is to be distinctly understood that the invention is not limited thereto, but may be otherwise variously embodied and practiced within the scope of the following claims. ACCORDINGLY,

What we claim is:

1. A data input and output device for a drive regulation apparatus operated by a digital computer, wherein a path regulation circuit of the drive regulation apparatus is subordinated to at least one velocity regulation circuit, comprising:
    a digital computer provided with a data bus;
    a digital tachometer;
    at least one path counter connected to said digital tachometer;
    a further digital tachometer;
    a velocity counter connected to said further digital tachometer;
    an interface for directly connecting said path counter and said velocity counter to said data bus of the digital computer;
    said interface being provided with an interrupt input;
    said digital computer being provided with at least one random access memory having storage locations;
    an interval transmitter controlling the input and output of data;

said interval transmitter being connected with said interrupt input of the interface;

said storage locations of said at least one random access memory of the digital computer storing during each interrupt the results of a predetermined number of readings of the path and velocity counters;

a programmable multiple counter provided with control terminals and data input means;

said programmable multiple counter being connected by means of said control terminals with the interface and by means of said data input means with the data bus of the digital computer;

said programmable multiple counter being provided with a number of counters having start terminals and overflow terminals;

a synchronization device provided with trigger signal terminals and control signal terminals;

driver stages for adjusting members of the drive regulation apparatus; and said start terminals of the counters of the programmable multiple counters being connected to said trigger signal terminals of said synchronization device and said overflow terminals of the counters and said control signal terminals of the synchronization device being connected to said driver stages of said adjusting members of the drive regulation apparatus.

2. The data input and output device as defined in claim 1, further including:

a three-phase power supply;

the synchronizing device comprises for each phase of said three-phase power supply a transformer, a filter, a first diode, a second diode and a signal generator;

each of said first and second diodes having an anode and a cathode;

said transformer having a secondary winding;

the anodes of said first and second diodes being connected to one another and the cathodes of said first and second diodes being connected by means of the filter with the secondary winding of the transformer;

said signal generator comprising two transistors each having a base, collector and emitter;

a voltage source having a positive pole and a null potential;

resistances for connecting the bases of said transistors with the positive pole of said voltage source;

further diodes for connecting said base of said transistors with the null potential of said voltage source;

said two transistors defining a first transistor and a second transistor;

a further resistance for connecting the base of the first transistor to the anodes of the first and second diodes;

a still further resistance for connecting the base of the second transistor to the cathode of the second diode; and the collector of the first transistor is connected to a related one of the trigger signal terminals of the synchronizing device and the collector of the second transistor is connected to a related one of the control signal terminals of the synchronization device.

3. The data input and output device as defined in claim 1, wherein:

said digital computer is provided with a read-only memory having storage locations for input of a current actual value of a current regulation circuit subordinated to the velocity regulation circuit;

the drive regulation apparatus being provided with an excitation winding;

one of said counters of said programmable multiple counter being operatively associated with said excitation winding; and constants of said excitation winding of the drive regulation apparatus being stored in said storage locations of the read-only memory, where the current actual value of the excitation winding can be computed in dependence of the last counter level of said one counter of the programmable multiple counter which is operatively associated with said excitation winding.

4. The data input and output device as defined in claim 1, wherein:

the interval transmitter comprises a counter, a frequency divider and a $J\overline{K}$ flip-flop;

said frequency divider having an output;

said interface having a release output connected with said interval transmitter;

an intermediate memory means comprising two addressable latches and provided with inputs and data outputs;

said counter of the interval transmitter having data inputs;

the data inputs of said counter of said interval transmitter being connected to the data outputs of said intermediate memory means;

said digital computer being provided with an address bus and an input-output bus containing a data output conductor;

said two addressable latches being connected at their inputs with said address bus and with said data output conductor of said input-output bus of the digital computer;

said counter of said interval transmitter having a clock pulse terminal, an overflow terminal and a loading terminal;

said $J\overline{K}$ flip-flop having a clock terminal, a clearing terminal and an output;

said overflow terminal and said loading terminal of the counter of the interval transmitter being connected with one another and with the clock terminal of the $J\overline{K}$ flip-flop, the output of which is connected with the interrupt input of the interface and the clearing terminal of which is connected with said release output of the interface; and said clock pulse terminal of the counter is connected to the output of the frequency divider.

* * * * *